(12) United States Patent
Abe et al.

(10) Patent No.: US 9,299,308 B2
(45) Date of Patent: Mar. 29, 2016

(54) DISPLAY DEVICE

(71) Applicant: Japan Display Inc., Tokyo (JP)

(72) Inventors: Hiroyuki Abe, Tokyo (JP); Masahiro Maki, Tokyo (JP); Takayuki Suzuki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/615,410

(22) Filed: Feb. 5, 2015

(65) Prior Publication Data

US 2015/0154928 A1    Jun. 4, 2015

Related U.S. Application Data

(63) Continuation of application No. 13/645,637, filed on Oct. 5, 2012, now Pat. No. 8,982,114.

(30) Foreign Application Priority Data

Oct. 6, 2011    (JP) .................... 2011-221543

(51) Int. Cl.
*G09G 3/36* (2006.01)
*G11C 19/28* (2006.01)
*G09G 1/00* (2006.01)

(52) U.S. Cl.
CPC .............. *G09G 3/3677* (2013.01); *G09G 1/005* (2013.01); *G11C 19/28* (2013.01); *G09G 2310/0283* (2013.01); *G09G 2310/0286* (2013.01)

(58) Field of Classification Search
CPC ........... G09G 1/00; G09G 1/005; G09G 3/36; G09G 3/3677; G09G 5/00; G11C 19/00; G11C 19/28
See application file for complete search history.

(56) References Cited

U.S. PATENT DOCUMENTS

| 7,929,658 B2 | 4/2011 | Lin |
| 8,218,713 B2 | 7/2012 | Hsu |
| 8,421,736 B2 | 4/2013 | Park |

(Continued)

FOREIGN PATENT DOCUMENTS

| CN | 101110179 A | 1/2008 |
| JP | 2000-347628 A | 12/2000 |
| JP | 2001-506044 A | 5/2001 |
| JP | 2001-350438 A | 12/2001 |
| JP | 2002-008388 A | 1/2002 |

(Continued)

OTHER PUBLICATIONS

Office Action dated Aug. 18, 2015 regarding a corresponding Japanese Patent Application No. 2011-221543.

(Continued)

*Primary Examiner* — Amr Awad
*Assistant Examiner* — Wing Chow
(74) *Attorney, Agent, or Firm* — Typha IP LLC

(57) ABSTRACT

A display device includes a first-stage output circuit adapted to perform output to a first-stage output signal line as an endmost output signal line out of a plurality of output signal lines disposed in parallel to each other, and the first-stage output circuit includes a start signal line to which a start signal for applying a conducting potential sequentially to the plurality of output signal lines is applied, a first clock signal line to which a first clock signal is applied, a second clock signal line to which a second clock signal is applied, a first transistor having a source to which the first-stage output signal line is connected, and a drain to which the first clock signal line is connected, and a second transistor having a gate to which the start signal line is connected.

8 Claims, 15 Drawing Sheets

(56) References Cited

U.S. PATENT DOCUMENTS

| | | |
|---|---|---|
| 2007/0115245 A1 | 5/2007 | Nakao |
| 2010/0067646 A1 | 3/2010 | Liu |
| 2011/0002438 A1* | 1/2011 | Kim ................ G11C 19/28 377/67 |
| 2011/0013740 A1* | 1/2011 | Lin ................. G11C 19/28 377/79 |
| 2011/0157112 A1 | 6/2011 | Shibata |

FOREIGN PATENT DOCUMENTS

| | | |
|---|---|---|
| JP | 2005-094335 A | 4/2005 |
| JP | 2009-245564 A | 10/2009 |
| JP | 2010-73301 A | 4/2010 |

OTHER PUBLICATIONS

Office Action in CN201210385235.8 dated May 14, 2014 (partial English language translation).

* cited by examiner

DISPLAY DEVICE

CROSS-REFERENCE TO RELATED APPLICATION

This application is a continuation of U.S. patent application Ser. No. 13/645,637, filed on Oct. 5, 2012, which claims priority from Japanese application JP2011-221543 filed on Oct. 6, 2011, the content of which is hereby incorporated by reference into this application.

BACKGROUND OF THE INVENTION

1. Field of the Invention

The present invention relates to a display device.

2. Description of the Related Art

As a display device of an information communication terminal such as a computer and a television receiver, a liquid crystal display device is used widely. Further, an organic EL display device (OLED), a field emission display device (FED), and so on are also known as thin display devices. The liquid crystal display device is a device for displaying an image by varying the orientation of liquid crystal components, which are encapsulated between two substrates, using the variation in the electrical field to thereby control the level of the permeability of light transmitted through the two substrates and the liquid crystal components.

In the display devices, which apply voltages corresponding to predetermined grayscale values to respective pixels of a screen, including such a liquid crystal display device, there are arranged pixel transistors for applying the voltages corresponding to the grayscale values to the respective pixels. In general, gates of the pixel transistors corresponding to one line of the screen are connected to a single signal line (hereinafter referred to as a "scan signal line"), and a drive circuit controls the scan signal lines so as to sequentially output conduction voltages for setting the respective pixel transistors to a conductive state line by line. Further, some of the devices have a bidirectional scanning function of making it possible to perform output of the conduction voltage in both of the forward direction and the backward direction so that the device can perform display even when vertically flipping the screen. JP 2010-73301 A discloses a circuit for realizing the bidirectional scanning.

SUMMARY OF THE INVENTION

FIG. 13 is a diagram schematically showing an example of a bidirectional scanning circuit. As shown in this drawing, the bidirectional scanning circuit performs forward scanning of sequentially scanning a display area 802 from an upper part thereof and backward scanning of scanning the display area 802 from a lower part thereof, and the forward scanning and the backward scanning are realized by performing the scanning while alternately performing output from a plurality of output circuits disposed on the right and left of the display area 802.

The plurality of output circuits each have a first-stage output circuit 815 operating with a start signal VST as a trigger, and performing output, repeat output circuits 816 operating with the output from the output circuit opposed across the display area as a trigger, and performing the output, and a final-stage output circuit 817 for outputting a final-stage output using the output from the output circuit opposed thereto. FIG. 14 shows a circuit diagram of the first-stage output circuit 815 shown upper right and lower left of FIG. 13. In order to reduce the circuit size, it is arranged that the same start signal VST is input in the forward scanning and the backward scanning.

FIG. 15 is a timing chart showing the variations in a signal input in the forward scanning, and signals of nodes N1, N2, and an output $V_{out0}$ in the first-stage output circuit 815 (see FIG. 14) shown in the upper right of FIG. 13. As shown in the timing chart, it is arranged that the node N1 is set to a High level in response to the input of the start signal VST, and then the output $V_{out0}$ signal is output in response to the High level of a clock signal CK3.

FIG. 16 shows a timing chart in the case in which a signal for the backward scanning is input in the first-output circuit 815 similarly shown in the upper right of FIG. 13. As shown in this drawing, when performing the backward scanning, in the first-stage output circuit 815 located in the upper right of the drawing, the node N1 rises to the High level due to the start signal VST, but the output $V_{out0}$ signal is never output because the potential of the node N1 is dropped by a clock signal CK1 before the clock signal CK3 for output reaches the High level.

As seen in the timing charts of FIGS. 15 and 16, the clock signals CK2, CK3 are stopped when outputting the start signal VST. However, since the configuration of a clock signal generation circuit required to be stopped in accordance with the timing of the start signal VST as described above makes the circuit size grow, and causes a lot of waste in the cost, it is possible to make the first-stage output circuit 815 operate while keeping the continuous clock signal as shown in FIG. 17. Also in this case, as shown in the timing chart of FIG. 17, the circuit can be operated without trouble in the case of the forward scanning. However, when performing the backward scanning, the output from the first-stage output circuit located in the upper right may occur in some cases as shown in a timing chart shown in FIG. 18.

The present invention is made in view of the circumstances described above, and has an object of providing a display device capable of bidirectional scanning with a circuit size reduced by making it possible to perform the bidirectional scanning without stopping a clock signal.

A display device according to an aspect of the present invention includes a drive circuit adapted to apply sequentially, a conducting potential which is an electrical potential to set a transistor to a conductive state, to a plurality of output signal lines disposed in parallel to each other, wherein the drive circuit has a first-stage output circuit which is a circuit adapted to perform output to a first-stage output signal line which is an endmost output signal line out of the plurality of output signal lines, and the first-stage output circuit includes a start signal line to which a start signal for applying the conducting potential sequentially to the plurality of output signal lines is applied, a first clock signal line to which a first clock signal which is a clock signal is applied, a second clock signal line to which a second clock signal, which is a clock signal, is applied, a period when the second clock signal has the conducting potential doesn't overlap a period when the first clock signal has the conducting potential, a first transistor having a source and a drain, one of which the first-stage output signal line is connected directly or indirectly to, and the other of which the first clock signal line is connected directly or indirectly to, a node connected directly or indirectly to a gate of the first transistor, and a second transistor having a gate to which the start signal line is connected, and connecting the second clock signal line and the node in response to setting the start signal line to the conducting potential.

Here, it is assumed that the output signal line also includes an output signal line to a dummy circuit and so on outside a display area besides scanning signal lines inside the display area, and means to include all of the signal lines to which a conducting signal is sequentially applied including the inside of the display area.

Further, in the display device according to the present invention, it is possible that a timing at which a signal on the start signal line is set to the conducting potential is a minimal time earlier than a timing at which a signal on the second clock signal line is set to the conducting potential, the minimal time being sufficiently shorter than a period of the clock signal.

Further, in the display device according to the present invention, it is possible that a timing at which a signal on the start signal line is set to a nonconducting potential of preventing the transistor from being set to a conductive state is a minimal time earlier than a timing at which the second clock signal line is set to the nonconducting potential, the minimal time being sufficiently shorter than a period of the clock signal.

Further, in the display device according to the present invention, it is possible that there are further provided a third clock signal line to which a third clock signal, which is a clock signal, is applied, a period when the third signal has the conducting potential doesn't overlap both of a period when the second clock signal has the conducting potential and a period when the first clock signal has the conducting potential, a nonconducting potential holding line adapted to hold the nonconducting potential of preventing the transistor from being set to the conductive state, and a third transistor having a gate to which the third clock signal line is connected and adapted to connect the node and the nonconducting potential holding line to each other in response to setting the third clock signal line to the conducting potential.

Further, in the display device according to the present invention, it is possible that a next-stage output signal line, which is the output signal line and disposed adjacent to the first-stage output signal line, connects with the node via a rectifying device in response to setting the next-stage output signal line to the conducting potential.

Further, in the display device according to the present invention, it is possible that the conducting potential is applied to the next-stage output signal line on an opposite side to a side where the conducting potential is applied to the first-stage output signal line across the display area where an image is displayed.

Further, in the display device according to the present invention, it is possible that the drive circuit includes a first first-stage output circuit as the first-stage output circuit adapted to perform output to the output signal line at one end of the plurality of output signal lines disposed in parallel to each other, and a second first-stage output circuit as the first-stage output circuit adapted to perform output to the output signal line at the other end of the plurality of output signal lines disposed in parallel to each other, and performs a forward scanning of setting pixel transistors to the conductive state sequentially from the one end, and a backward scanning of setting the pixel transistors to the conductive state sequentially from the other end while switching between the forward scanning and the backward scanning, and the start signal line is common to the forward scanning and the backward scanning.

DETAILED DESCRIPTION OF THE INVENTION

Figure 1:
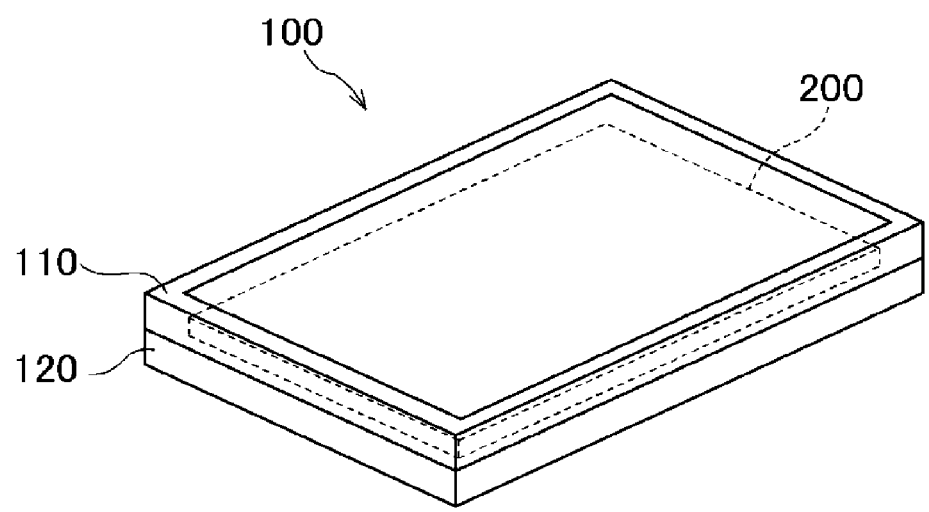
FIG. 1 is a diagram schematically showing a display device according to an embodiment of the present invention.

Hereinafter, an embodiment of the present invention will be described with reference to the accompanying drawings. It should be noted that in the drawings, the same or equivalent elements will be denoted with the same reference symbols, and redundant explanations will be omitted. It should be noted that it is assumed that a reference symbol attached to each of signals represents a signal line to which the signal is applied.

FIG. 1 schematically shows a display device 100 according to an embodiment of the present invention. As show in the drawing, the display device 100 is composed of a display panel 200 and so on fixed so as to be sandwiched between an upper frame 110 and a lower frame 120. It should be noted that the display panel 200 can be any display panel such as a liquid crystal display panel or an organic EL display panel providing the display panel uses a thin film transistor substrate. In the present embodiment, it is assumed that the display panel 200 is the liquid crystal display panel.

Figure 2:
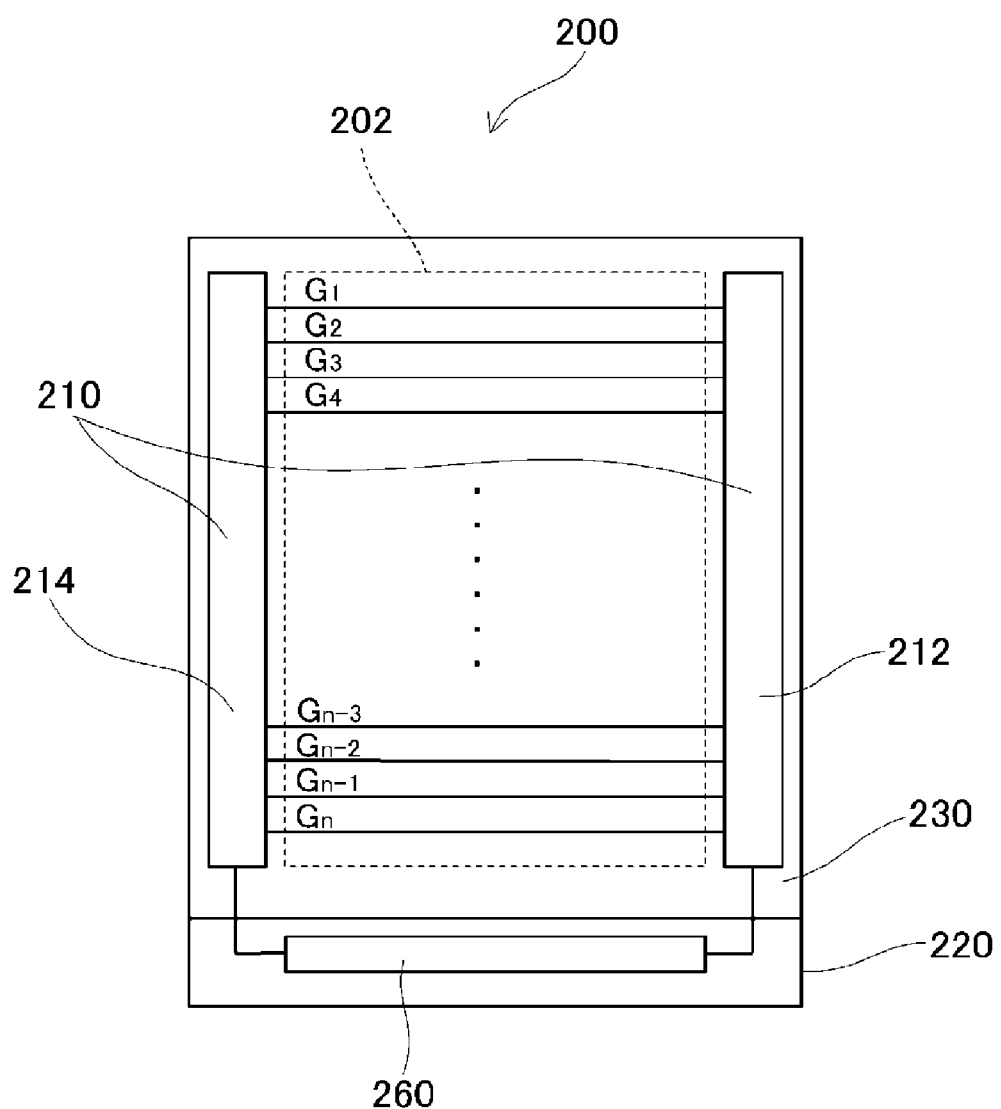
FIG. 2 is a diagram showing a configuration of a display panel shown in FIG. 1.

FIG. 2 shows a configuration of the display panel 200 shown in FIG. 1. The display panel 200 has two substrates, namely a thin film transistor (TFT) substrate 220 and a color filter substrate 230, and liquid crystal components are encapsulated between these substrates. The TFT substrate 220 has a drive circuit 210 for applying predetermined voltages sequentially to scanning signal lines $G_1$ through $G_n$. In addition, the TFT substrate 200 has a drive integrated circuit (IC) 260 for controlling the drive circuit 210 and applying voltages corresponding to grayscale values of respective pixels to a plurality of data signal lines not shown extending in a pixel area 202 so as to intersect perpendicularly with the scanning signal lines $G_1$ through $G_n$. It should be noted that the drive circuit 210 has a right-hand drive circuit 212 located on the right of the pixel area 202 when facing the drawing, and a left-hand drive circuit 214 located on the left of the pixel area 202.

Figure 3:
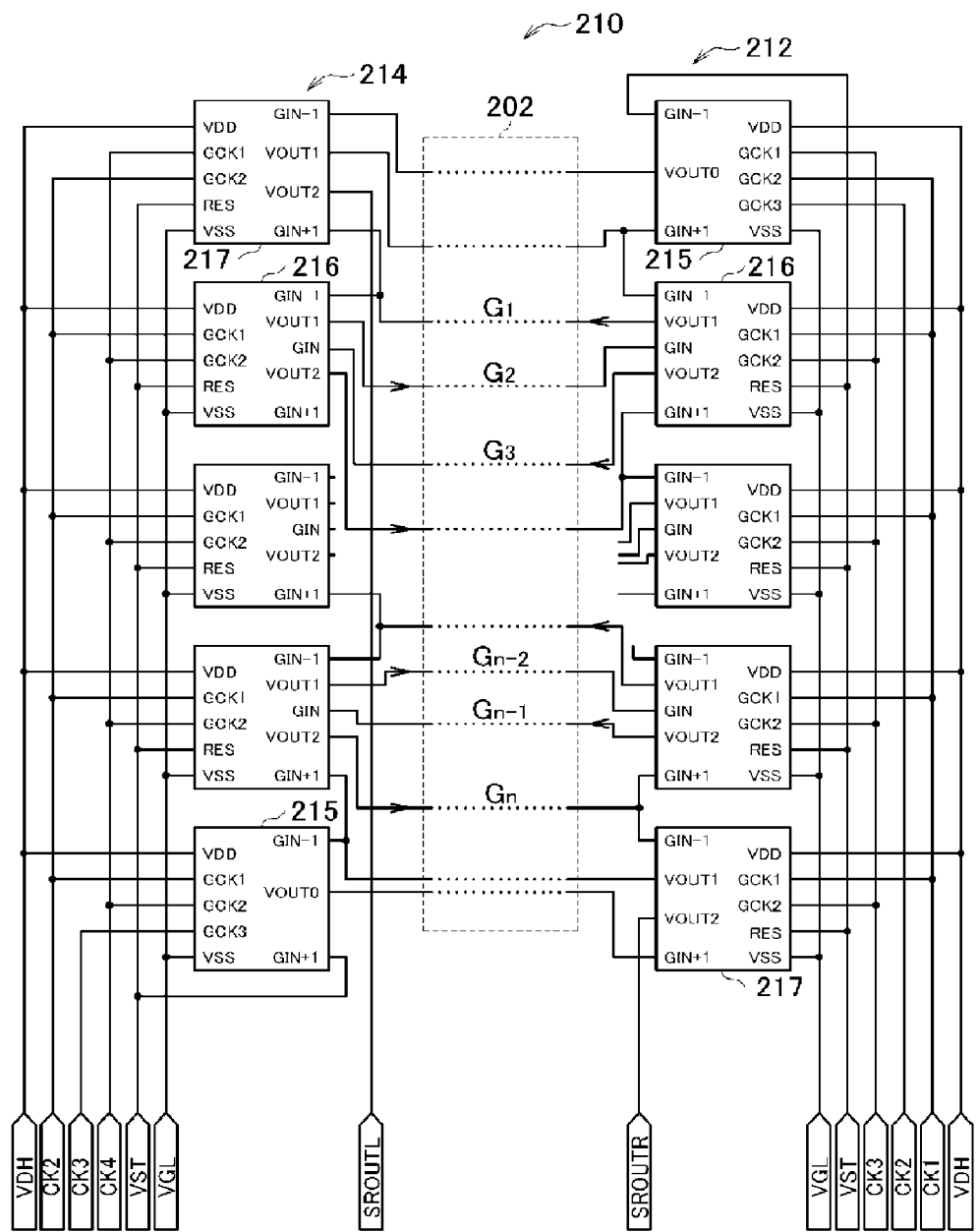
FIG. 3 is a diagram schematically showing a configuration of a drive circuit shown in FIG. 2.

FIG. 3 is a diagram schematically showing a circuit configuration of the drive circuit 210 shown in FIG. 3. As shown in the drawing, the right-hand drive circuit 212 is a drive circuit for applying a High level (a conducting voltage) for making a conductive state between a source and a drain of a TFT to a gate of the TFT disposed to each of the pixels with respect to odd-numbered scanning signal lines $G_{2i-1}$ (i denotes a natural number), and the left-hand drive circuit 214 is a drive circuit for applying the High level for making the conductive state between the source and the drain of the TFT to the gate of the TFT disposed to each of the pixels with respect to even-numbered scanning signal lines $G_{2i}$. The right-hand drive circuit 212 and the left-hand drive circuit 214 each have a first-stage output circuit 215, a final-stage output circuit 217, and a repeat output circuit 216 disposed between the first-stage output circuit 215 and the final-stage output circuit 217. The repeat output circuit 216 of the right-hand drive circuit 212 performs output using an output of the left-hand drive circuit 214 as a trigger, and the repeat output circuit 216 of the left-hand drive circuit 214 performs output using an output of the right-hand drive circuit 212 as a trigger. The first-stage output circuit 215 performs output using a start signal VST as a trigger. It should be noted that the start signal VST of the right-hand drive circuit 212 and the start signal VST of the left-hand drive circuit 214 are the same signals, and are simultaneously input to the first-stage output circuits 215 on the respective sides. The right-hand drive circuit 212 except the first-stage output circuit 215 is driven by clock signals CK1, CK3, and the first-stage output circuit 215 of the right-hand drive circuit 212 uses a clock signal CK2 in addition to the clock signals CK1, CK3. Further, the left-hand drive circuit 214 except the first-stage output circuit 215 is driven by the clock signal CK2, and a clock signal CK4, and the first-stage output circuit 215 of the left-hand drive circuit 214 uses the clock signal CK3 in addition to the clock signals CK2, CK4. Further, the clock signals CK1 through CK4 are a four-phase clock taking the High level in the order of CK1, CK2, CK3, and CK4 in a forward scanning, and are a four-phase clock taking the High level in the order of CK4, CK3, CK2, and CK1 in a backward scanning.

The forward scanning starts with the output of the High level to an output $V_{out0}$ of the first-stage output circuit 215 of the right-hand drive circuit 212 using the start signal VST as a trigger, and then ends with the final-stage output circuit 217 of the right-hand drive circuit 212. The backward scanning starts with the output to the output $V_{out0}$ of the first-stage output circuit 215 of the left-hand drive circuit 214 using the start signal VST as a trigger, and then ends with the final-stage output circuit 217 of the left-hand drive circuit 214.

Figure 4:
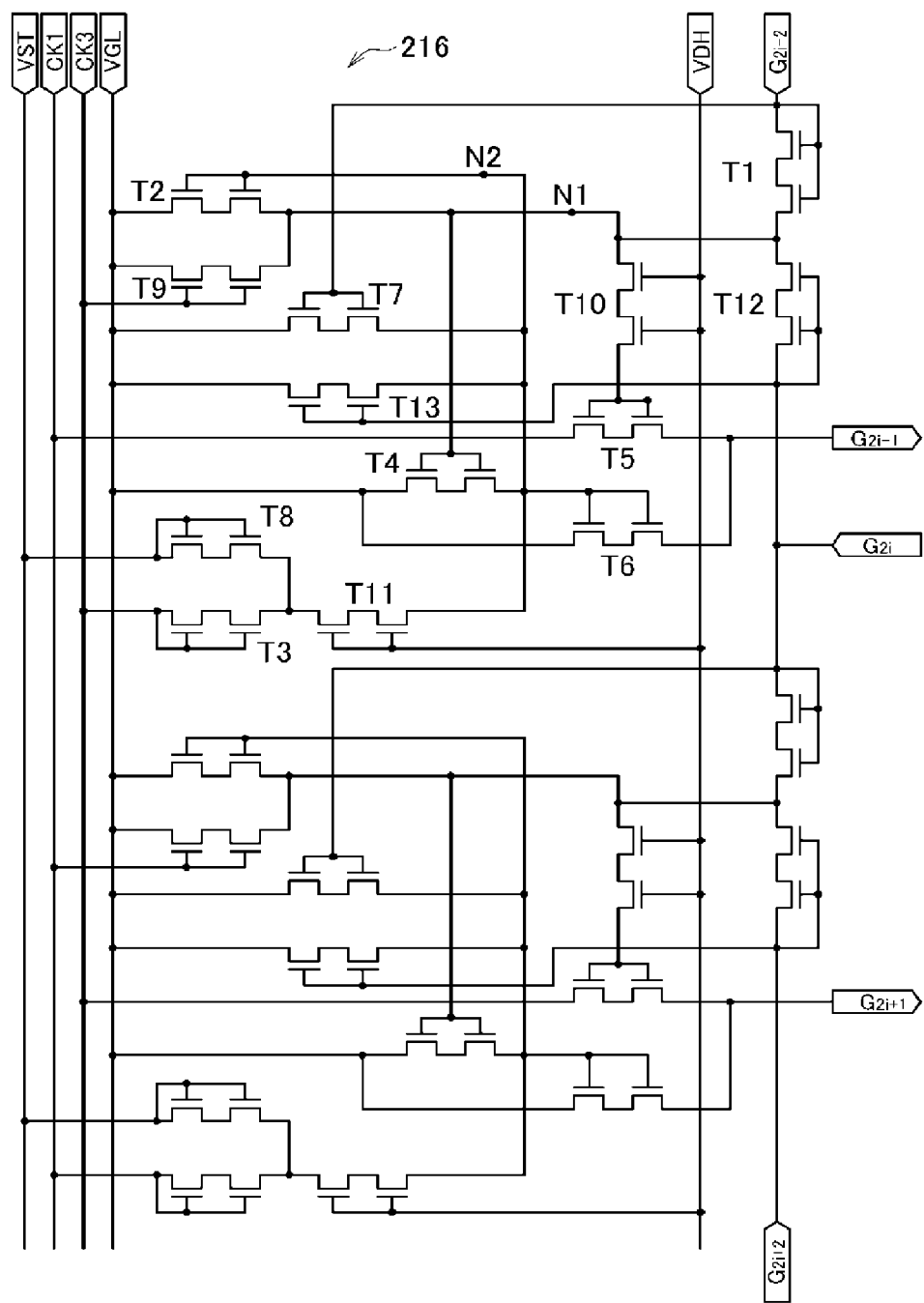
FIG. 4 is a diagram concretely showing a circuit configuration of a repeat output circuit of a right-hand drive circuit shown in FIG. 3.

FIG. 4 specifically shows a circuit configuration of the repeat circuit 216 of the right-hand drive circuit 212. Here, names of terminals shown in FIG. 4 are changed to names of external terminals of the drive circuit 210 shown in FIG. 3 instead of names of terminals of the repeat output circuit 216 shown in FIG. 3 for the sake of the explanation in a timing chart shown in FIG. 7 described later. As shown in FIG. 4, the repeat output circuit 216 is a circuit operating with the two clock signals CK1, CK3, and the part for performing output to two scanning signal lines $G_{2i-1}$, $G_{2i+1}$ is illustrated. It should be noted that a reference symbol T denotes a transistor, and a reference symbol N denotes a node. It should be noted that each of the transistors is formed of low-temperature polysilicon (LIPS).

As shown in the drawing, the circuit for performing the output to the scanning signal line $G_{2i-1}$ is composed of a diode transistor T1 to form an input circuit when performing the forward scanning, a transistor T2 for fixing a gate electrode of a transistor T5 described later to a Low level (VGL) as a non-conducting voltage of the transistor, a transistor T3 for charging a holding node N2, a transistor T4 for resetting the holding node, the transistor T5 for outputting the High level to the scanning signal line $G_{2i-1}$, a transistor T6 for fixing the scanning signal line $G_{2i-1}$ to the voltage VGL using the holding node N2, a transistor T7 for resetting the holding node N2 using an input signal when performing the forward scanning, a transistor T8 for an initial reset, a transistor T9 for resetting the gate electrode of the transistor 5, a voltage reduction transistor T10 to limit the rise in a voltage of a gate of the transistor T5 to an intermediate voltage VHD, a transistor T11 for dropping a voltage charged by the transistor T3 at the intermediate voltage VDH, a diode transistor T12 forming an input of the circuit when performing the backward scanning, and a transistor T13 for resetting the holding node N2 to the voltage VGL using an input signal when performing the backward scanning. It should be noted that the intermediate voltage VDH is a voltage lower than a voltage VGH as the High level of the scanning signal line $G_{2i-1}$, and has a level enough for setting the transistor to the conductive state. Here, the intermediate voltage VDH is also shown as the High level.

Figure 5:
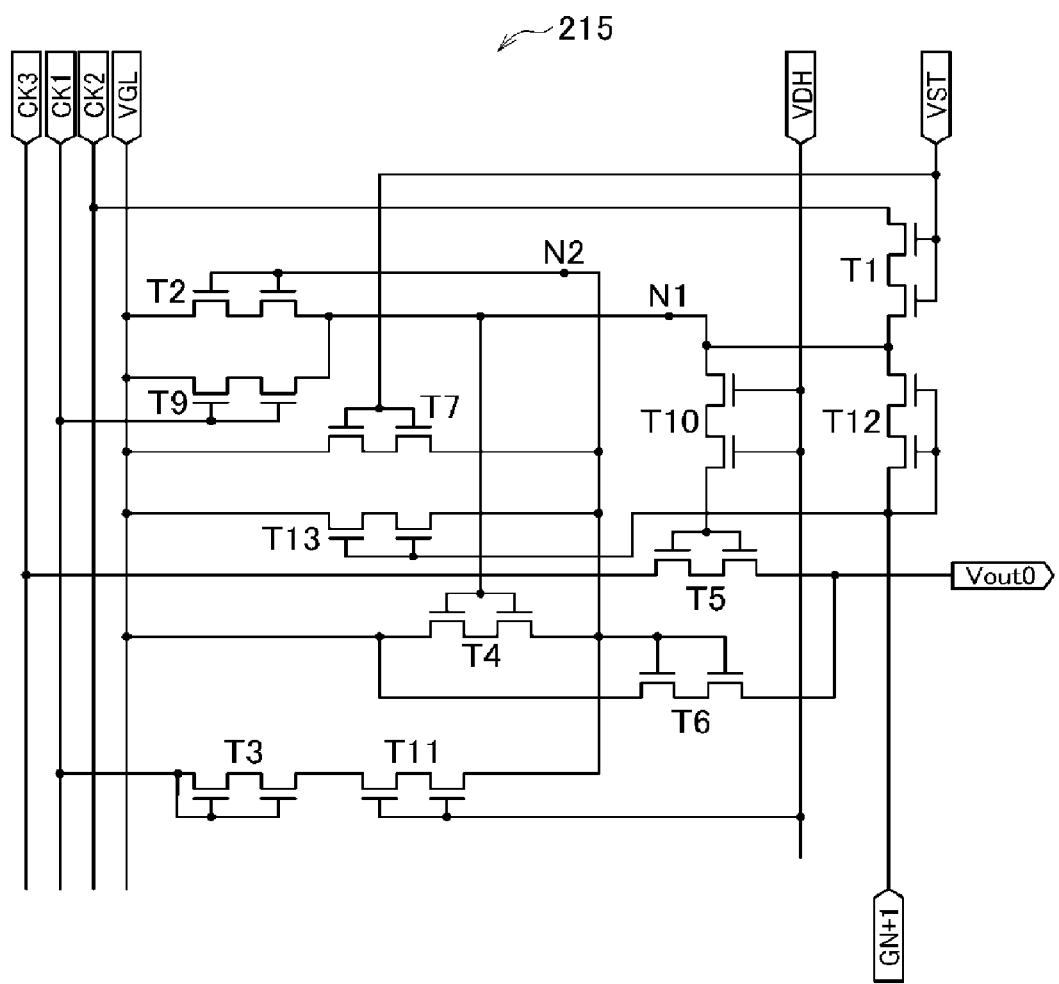
FIG. 5 is a diagram showing a circuit configuration of a first-stage output circuit of the right-hand drive circuit shown in FIG. 3.

FIG. 5 shows a circuit configuration of the first-stage output circuit 215 to be the first stage of the circuit. Although the configuration of the first-stage output circuit 215 is basically the same as the configuration of the repeat output circuit 216, the start signal VST is connected to a gate of the transistor T7, and at the same time a gate of the transistor T1, and the drain side of the transistor T1 is connected to the clock signal CK2. Further, the configuration in which the transistor T8 for the initial reset is not disposed is adopted. The operation of the first-stage output circuit will be described later.

Figure 6:
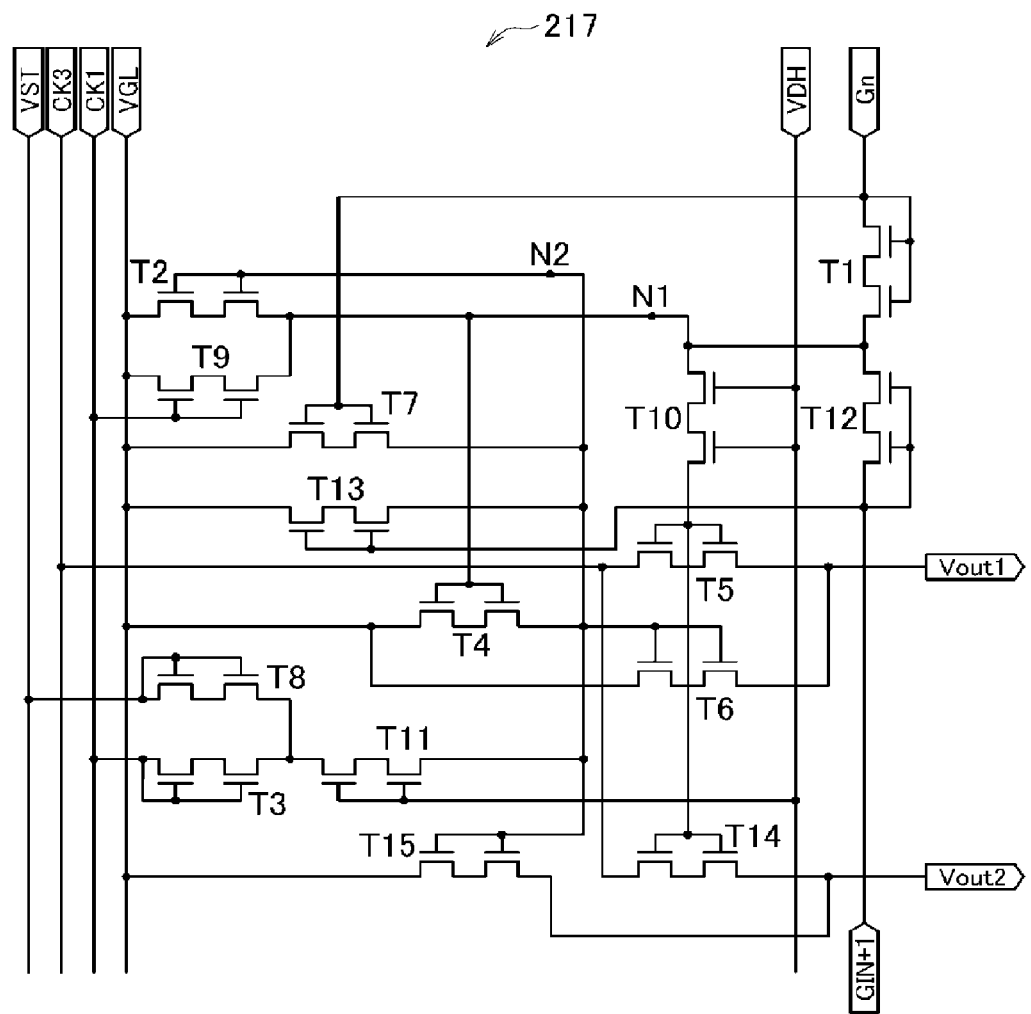
FIG. 6 is a diagram showing a circuit configuration of a final-stage output circuit of the right-hand drive circuit shown in FIG. 3.

FIG. 6 shows a circuit configuration of the final-stage output circuit 217 to be the final stage of the circuit. The final-stage output circuit 217 has a configuration of adding transistors T14, T15 connected to a test terminal compared to the repeat output circuit 216.

Figure 7:
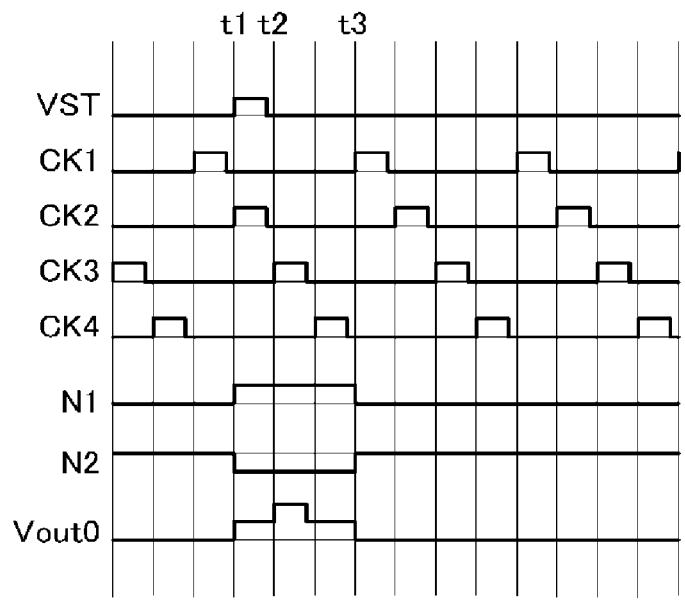
FIG. 7 is a timing chart of the operation in a forward scanning of the first-stage output circuit of the right-hand drive circuit shown in FIG. 5.
Figure 8:
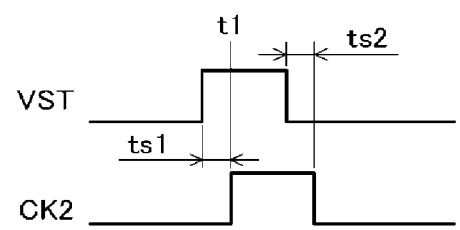
FIG. 8 is a diagram showing a timing difference between a start signal VST and a clock signal CK2 in the forward scanning.

FIG. 7 shows a timing chart of the operation in the forward scanning of the first-stage output circuit 215 of the right-hand drive circuit 212 shown in FIG. 5. Hereinafter, the operation of the first-stage output circuit 215 will be explained using the timing chart shown in FIG. 7. Firstly, by inputting the High level to the start signal line VST a minimal time ts1 before (see FIG. 8) the timing of the clock signal CK2 at a time point t1, the first-stage output circuit 215 sets the transistor T7 to the conductive state to thereby connect the node N2 to the Low level (VGL) to set the node N2 to the Low level. Then, the clock signal CK2 rises to the High level to thereby set the transistor T1 to the conductive state, and a level of a holding node N1 is set to the High level to thereby set the transistor T5 to the conductive state. As described above, by setting the start signal to the High level slightly before the clock signal CK2 reaches the High level, the node N2 can be dropped to the Low level before the node N1 reaches the High level, and therefore, a through current can be prevented, and improvement in reliability and reduction of the power consumption can be achieved. Further, a falling timing of the start signal VST is set a minimal time ts2 earlier than a falling timing of the clock signal CK2 (see FIG. 8). Thus, it is possible to keep the node N1 in the High level by cutting the transistor T1 in advance. Here, the minimal time means that the time is sufficiently shorter than a period of the clock signal.

Subsequently, when the clock signal CK3 is set to the High level at a timing of t2, the voltage of the gate of the transistor T5 is further raised due to a so-called bootstrap effect, and a High signal is output to the output $V_{out0}$, and subsequently a Low signal is output following the operation of the clock CK3.

Then, by the clock CK1 being set to the High level at a timing of t3, the transistor T3 is set to the conductive state, the node N2 is raised to the High level, and the transistor T9 is set to the conductive state, and therefore, the node N1 is dropped to the Low level. The node N1 cuts the connection between a source and a drain of the transistor T5 via the transistor T10, and at the same time, the transistor T6 is set to the conductive state due to the High level of the node N2 to thereby connect the output $V_{out0}$ to the Low level (VGL).

Here, the transistor T10 is provided with a double gate configuration having two transistors disposed tandemly with each other to thereby achieve a high withstand voltage so as to be able to stand the voltage raised by setting the clock signal CK3 to the High level. The High signal output to the output $V_{out0}$ becomes the input signal to the repeat output circuit 216 of the left-hand drive circuit 214, and the High signal is output to the scanning signal line $G_1$ by the operation similar to the above operation.

Figure 9:
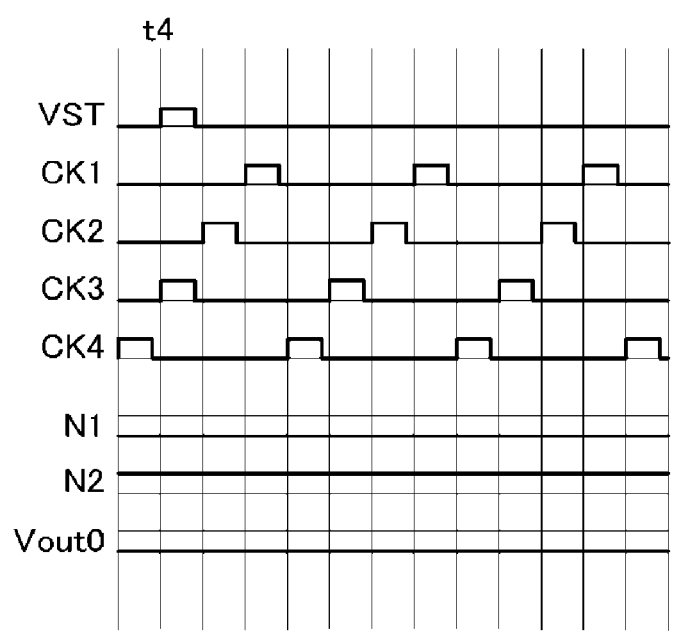
FIG. 9 is a timing chart of the operation in a backward scanning of the first-stage output circuit of the right-hand drive circuit shown in FIG. 5.

FIG. 9 shows a timing chart of the operation in the backward scanning of the first-stage output circuit 215 of the right-hand drive circuit 212 shown in FIG. 5. In comparison with FIG. 7, phases of the clock signals CK1 through CK4 are different, and are set to the High level in the reverse order. Firstly, at a timing of t4, the start signal VST is set to the High level in accordance with the clock signal CK3 in order to start the first-stage output circuit 215 of the left-hand drive circuit 214. Thus, although the node N1 is set to the High level, and the node N2 is set to the Low level in the first-stage output circuit 215 of the left-hand drive circuit 214, in the right-hand drive circuit 212, the transistor T1 is set to the conductive state, and the operation is not started due to the Low level of the clock CK2. Thus, even if the start signal VST is set to the High level in the backward scanning, the first-stage output circuit 215 of the right-hand drive circuit 212 fails to start the scanning.

As explained hereinabove, in the embodiment described above, since a bidirectional scanning becomes possible without stopping the clock signal, it becomes possible to obtain the display device capable of performing the bidirectional scanning with the circuit size reduced.

Further, since the circuit for scanning in the forward direction and the circuit for scanning the backward direction use the same circuit in the embodiment described above, there is no need to dispose the circuit for the backward scanning, and thus, the circuit size can be reduced to thereby reduce a frame area of the display device.

Further, since the double gate configuration of tandemly disposing the transistors is adopted, a high withstand voltage circuit can be obtained even with the LIPS transistors.

Figure 10:
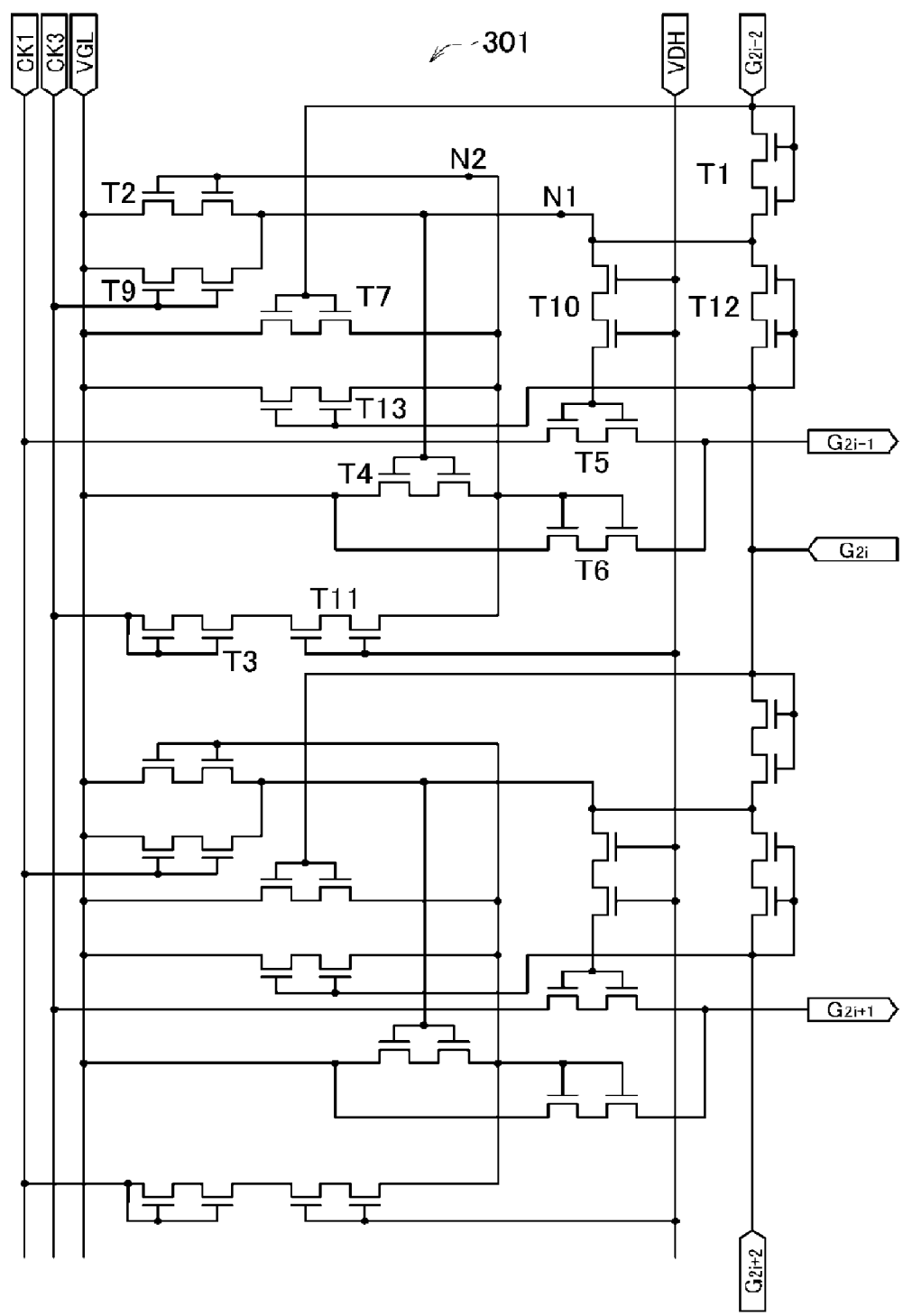
FIG. 10 is a diagram showing an output circuit as a modified example of the repeat output circuit shown in FIG. 4.
Figure 11:
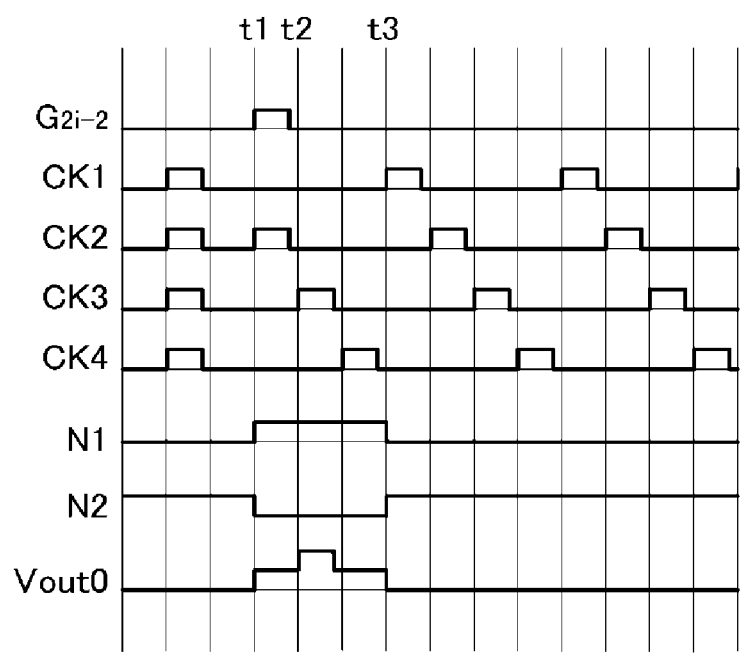
FIG. 11 is a timing chart in the case in which a configuration of eliminating a transistor T8 is adopted.

FIG. 10 shows an output circuit 301 as a modified example of the repeat output circuit 216 shown in FIG. 4 described above. The difference from the repeat output circuit 216 is the point that the transistor T8 is not disposed, and in the embodiment described above, the transistor T8 is disposed for charging the holding node N2 using the start signal VST. However, since it is also possible to charge the holding node N2 by setting all of the clock signals CK1 through CK4 to the High level, by using a drive method of setting the clock signals CK1 through CK4 simultaneously to the High level prior to the start signal VST as shown in FIG. 11, it is possible to adopt the configuration in which the transistor T8 is not disposed, and to further reduce the circuit size.

Figure 12:
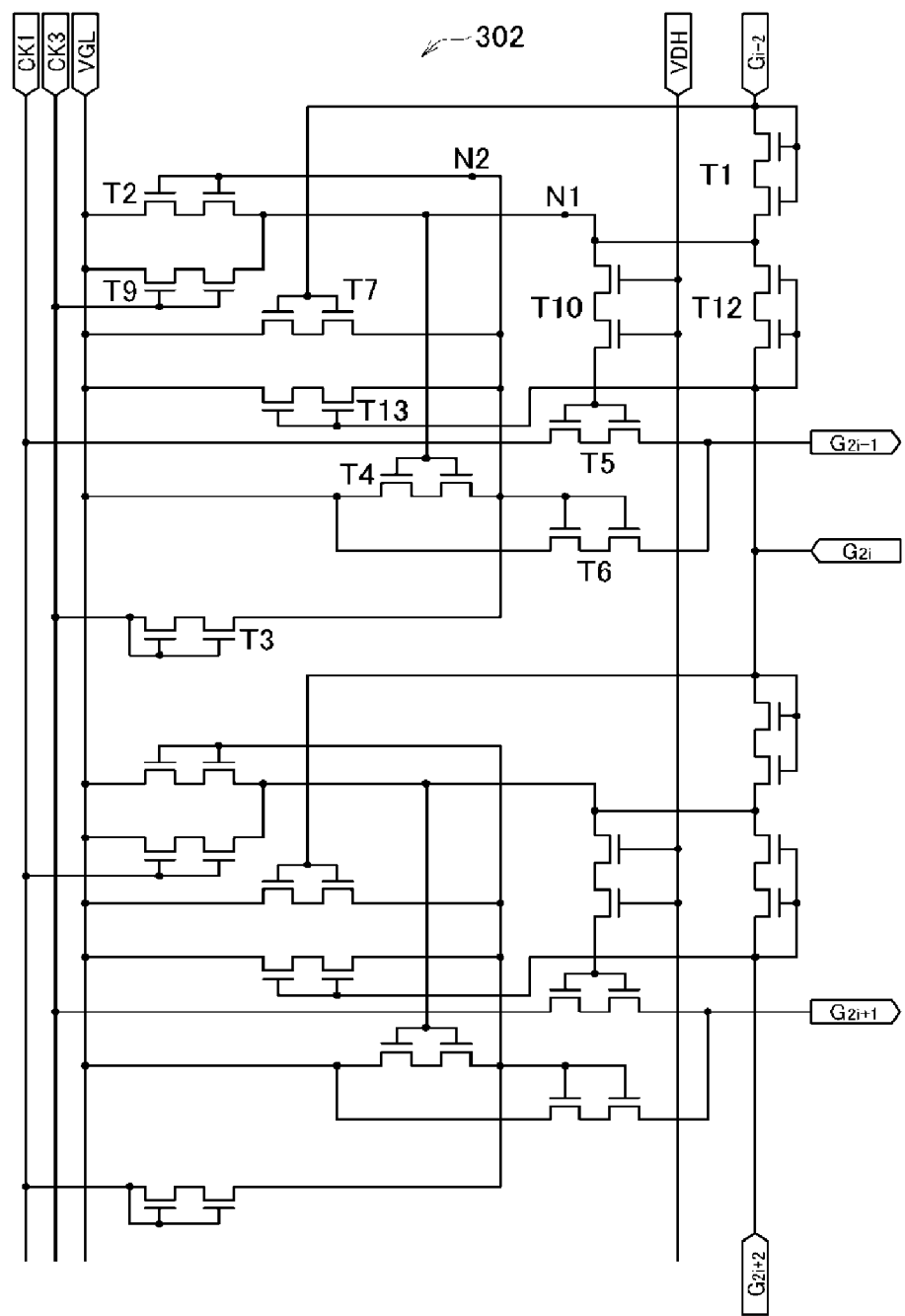
FIG. 12 is a diagram showing an output circuit as a modified example of the repeat output circuit shown in FIG. 4.
Figure 13:
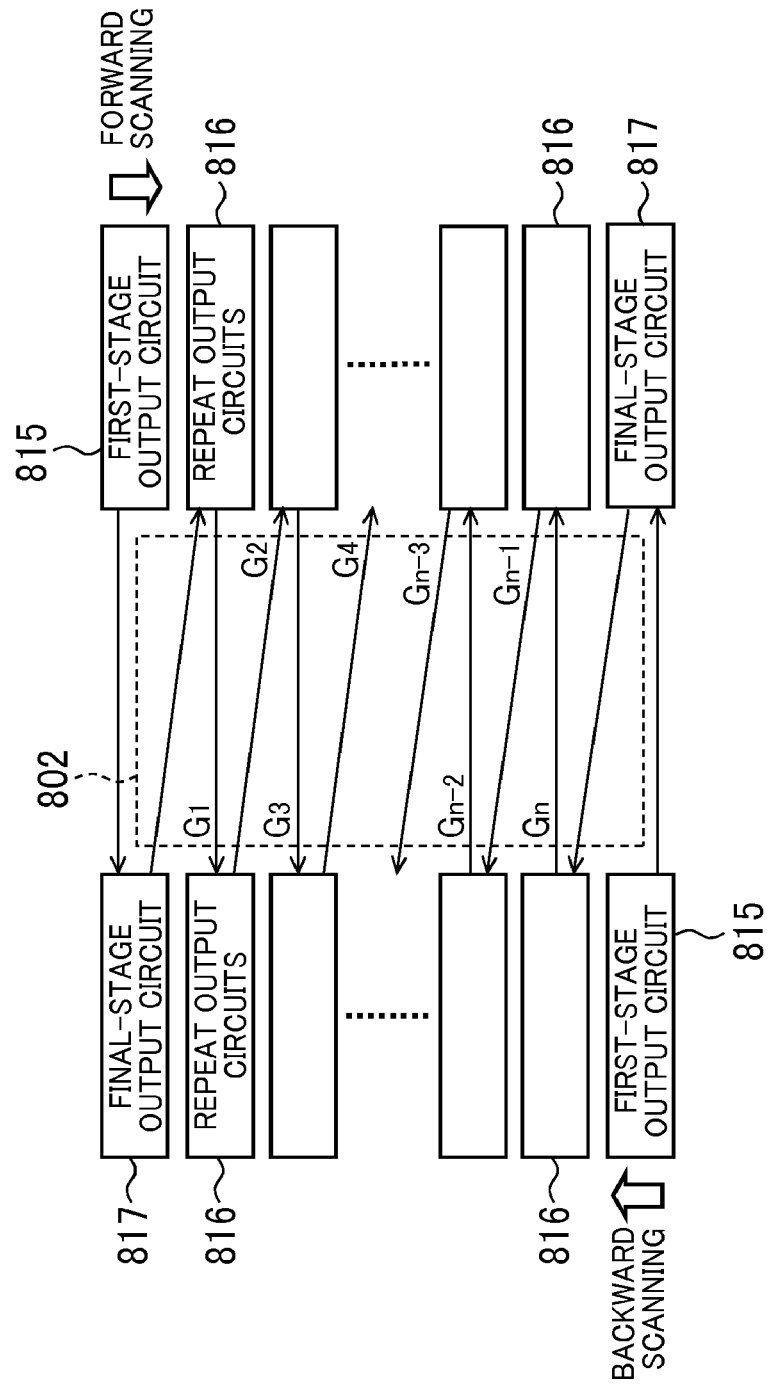
FIG. 13 is a diagram schematically showing an example of a bidirectional scanning circuit.
Figure 14:
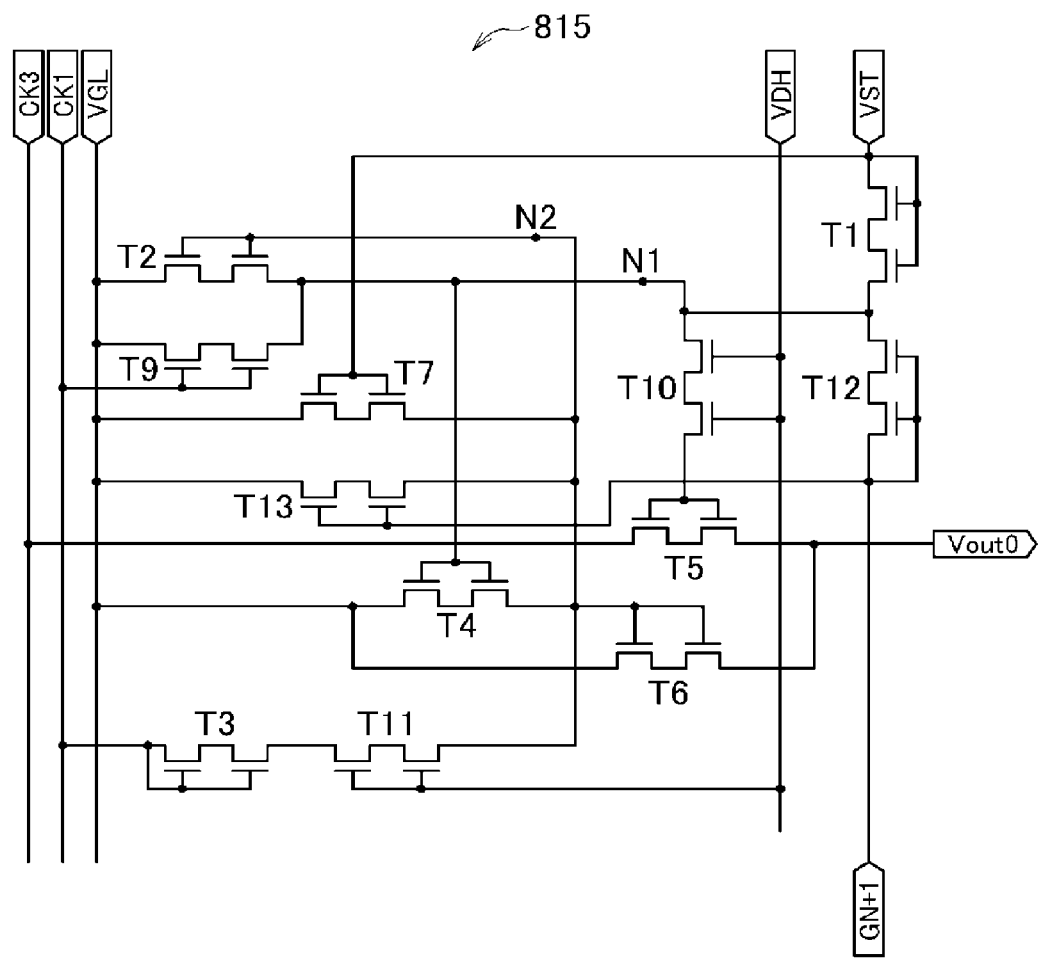
FIG. 14 is a circuit diagram of the first-stage output circuit shown in the upper right of FIG. 13.
Figure 15:
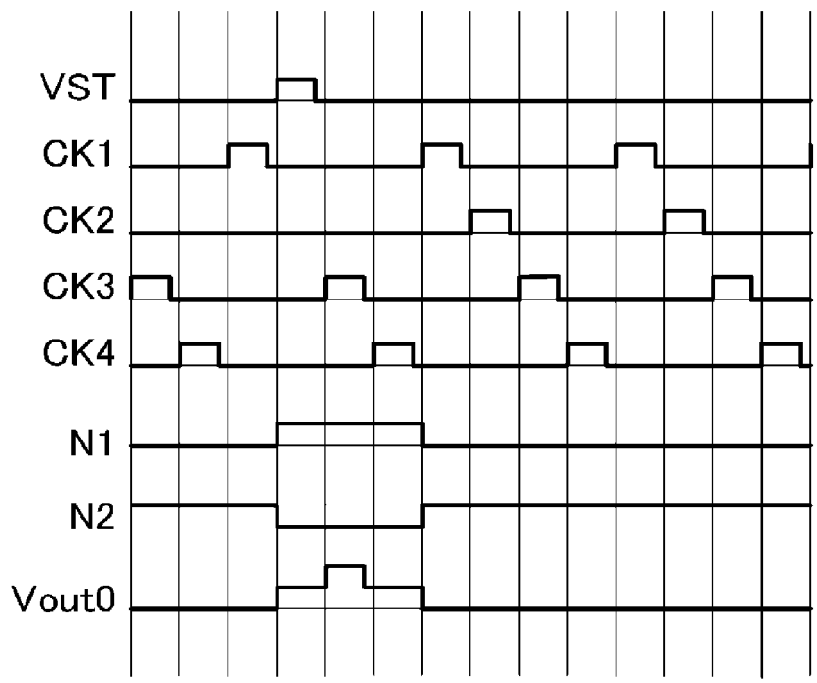
FIG. 15 is a timing chart showing variations in signals in the forward scanning of the first-stage output circuit.
Figure 16:
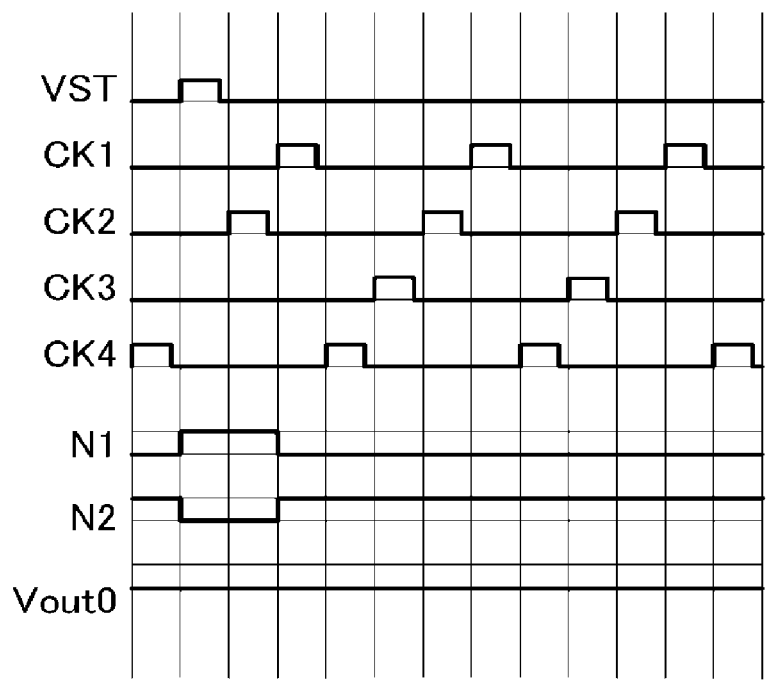
FIG. 16 is a timing chart showing variations in signals in the backward scanning of the first-stage output circuit.
Figure 17:
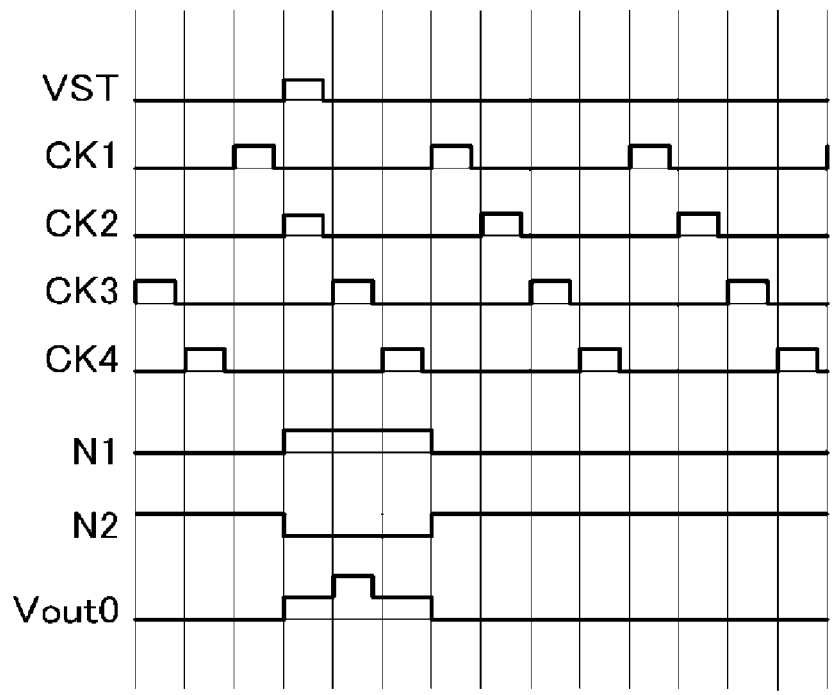
FIG. 17 is a timing chart showing variations in signals in the forward scanning of the first-stage output circuit in the case in which the first-stage output circuit is driven by a continuous clock signal.
Figure 18:
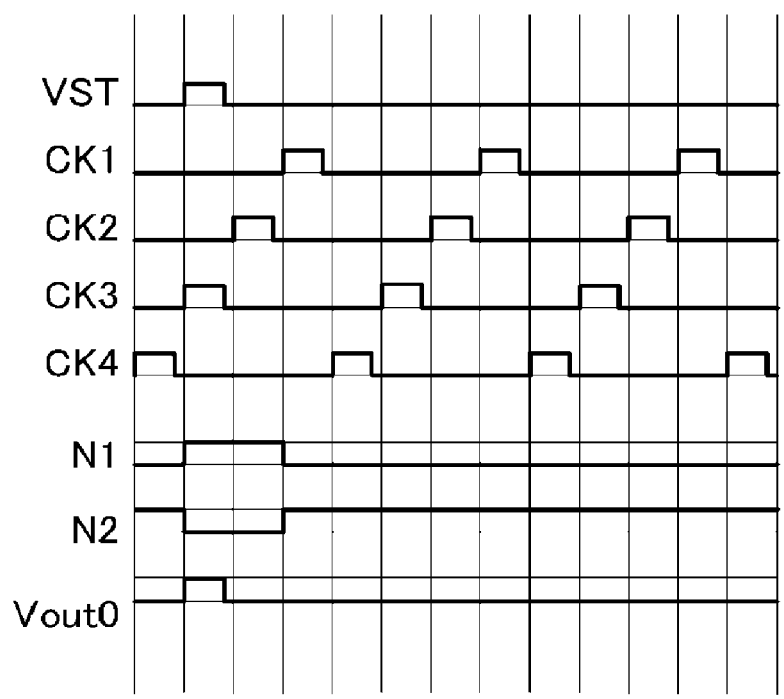
FIG. 18 is a timing chart showing variations in signals in the backward scanning of the first-stage output circuit in the case in which the first-stage output circuit is driven by the continuous clock signal.

FIG. 12 shows an output circuit 302 as a modified example of the repeat output circuit 216 shown in FIG. 4 described above. The difference from the repeat output circuit 216 is the point that the transistors T8, T11 are not disposed. Although the transistor T11 is disposed for preventing the high voltage of the clock signals CK1 through CK4 from being directly applied to gates of the transistors T2, T6, if the Na pollution in the manufacturing line can be suppressed, it is possible to adopt the configuration in which the transistor T11 is not disposed to thereby further reduce the circuit size.

It should be noted that in the embodiment described above, it is assumed that the High level is a conducting potential, and there are adopted NMOS transistors in which the conductive state is created between the source and the drain by inputting the High level to the gate, it is also possible to assume that the Low level is the conducting potential, and there are adopted PMOS transistors in which the conductive state is created between the source and the drain by inputting the Low level to the gate.

Further, in the embodiment described above, it is assumed that the four-phase clock is used as the clock signal, and the clock signal can also be realized using other clock signals.

While there have been described what are at present considered to be certain embodiments of the invention, it will be understood that various modifications may be made thereto, and it is intended that the appended claims cover all such modifications as fall within the true spirit and scope of the invention. For example, the liquid crystal display device according to the above embodiment can be a liquid crystal display device of either one of an in-plane switching (IPS) type, a vertically aligned (VA) type, and a twisted nematic (TN) type. Further, the present invention can be applied to an organic EL display device, a field emission display device (FED), and other display devices using the drive circuit besides the liquid crystal display device.

What is claimed is:
1. A shift register circuit comprising:
a plurality of cascaded stages including a first start-stage and M stages (M is natural number equal to or greater than 2);
a start signal line electrically connected with the first start-stage;
a plurality of output signal lines electrically connected with M stages respectively for applying a conducting potential which makes a pixel transistor electrically connecting with the output signal line conductive;
a first clock signal line electrically connected with the plurality of cascaded stages and applying a first clock signal;
a second clock signal line electrically connected with the plurality of cascaded stages and applying a second clock signal,
a third clock signal line electrically connected with the plurality of cascaded stages and applying a third clock signal,
wherein the first clock, the second clock and the third clock become the conducting potential in order,
wherein M stages and the first start-stage include an output transistor, a first node and a first node setting transistor, wherein the output transistor of M stages has a first electrode which is electrically connected with the output signal line, a second electrode which is electrically connected with the first clock signal line or the third clock signal line, and a gate electrode which is electrically connected with the first node, wherein the first node setting transistor of M stages has a first electrode which is electrically connected with the first node, a second electrode and gate electrode which are electrically connected with the first electrode of the output transistor of a previous stage, wherein the output transistor of the first start-stage has a first electrode which is electrically connected with the second electrode of the first node setting transistor of a first stage of M stages, a second electrode which is electrically connected with the third clock signal line, a gate electrode which is electrically connected with the first node of the first start-stage, and wherein the first node setting transistor of the first start-stage has a first electrode which is electrically connected with the first node of the first start-stage, a second electrode which is electrically connected with the second clock signal line, a gate electrode which is electrically connected with the start signal line.

2. The display device according to claim 1, wherein
the first start-stage includes a reset transistor,
the reset transistor has a gate electrode which is electrically connected with the first clock signal line and a first electrode which is electrically connected with the first node of the first start-stage, and a second electrode which is electrically connected with a low level voltage line.

3. The display device according to claim 1, wherein
the first start-stage includes a low level voltage output transistor and a second node,
the low level voltage output transistor has a gate electrode which is electrically connected with a second node, a first electrode which is electrically connected with the first electrode of the output transistor of the first start-stage, and a second electrode which is electrically connected with a low level voltage line.

4. A shift register circuit comprising:
a plurality of cascaded stages including a first start-stage, a second start-stage and M stages (M is natural number equal to or greater than 2);
a start signal line electrically connected with the first start-stage and the second start-stage;
a plurality of output signal lines electrically connected with M stages respectively for applying a conducting potential which makes a pixel transistor electrically connecting with the output signal line conductive;
a first clock signal line electrically connected with the plurality of cascaded stages and applying a first clock signal;
a second clock signal line electrically connected with the plurality of cascaded stages and applying a second clock signal,
a third clock signal line electrically connected with the plurality of cascaded stages and applying a third clock signal,
a fourth clock signal line electrically connected with the plurality of cascaded stages and applying a fourth clock signal,
an output signal line of the first start-stage configured to apply the conducting potential to a first stage of M stages;
an output signal line of the second start-stage configured to apply the conducting potential to a Mth stage of M stages;
wherein the first clock, the second clock, the third clock, and the fourth clock become the conducting potential in order when forward direction scanning,
wherein the fourth clock, the third clock, the second clock, and the first clock become the conducting potential in order when reverse direction scanning,
wherein M stages, the first start-stage, and the second start-stage include an output transistor, a first node and a first node setting transistor,
wherein the output transistor of the first stage of M stages has a first electrode which is electrically connected with the output signal line, a second electrode which is electrically connected with the first clock signal line, and a gate electrode which is electrically connected with the first node of the first stage of M stages,
wherein the first node setting transistor of the first stage of M stages has a first electrode which is electrically connected with the first node of the first stage of the M stages, a second electrode and gate electrode which are electrically connected with the first electrode of the output transistor of the first start-stage,
wherein the output transistor of the Mth stage of M stages has a first electrode which is electrically connected with the output signal line, a second electrode which is electrically connected with the fourth clock signal line, and a gate electrode which is electrically connected with the first node of the Mth stage of M stages,
wherein the first node setting transistor of the Mth stage of M stages has a first electrode which is electrically connected with the first node of the Mth stage of M stages, a second electrode and gate electrode which are electrically connected with the first electrode of the output transistor of the second start-stage,
wherein the output transistor of the first start-stage has a first electrode which is electrically connected with the second electrode of the first node setting transistor of a first stage of M stages, a second electrode which is electrically connected with the third clock signal line, a gate electrode which is electrically connected with the first node of the first start-stage,
wherein the first node setting transistor of the first start-stage has a first electrode which is electrically connected with the first node of the first start-stage, a second electrode which is electrically connected with the second clock signal line, a gate electrode which is electrically connected with the start signal line,
wherein the output transistor of the second start-stage has a first electrode which is electrically connected with the second electrode of the first node setting transistor of the Mth stage of the M stages, a second electrode which is electrically connected with the second clock signal line, a gate electrode which is electrically connected with the first node of the second start-stage, and
wherein the first node setting transistor of the second start-stage has a first electrode which is electrically connected with the first node of the second start-stage, a second electrode which is electrically connected with the third clock signal line, a gate electrode which is electrically connected with the start signal line.

5. The display device according to claim 4, wherein
the first start-stage includes a reset transistor,
the reset transistor has a gate electrode which is electrically connected with the first clock signal line and a first electrode which is electrically connected with the first node of the first start-stage, and a second electrode which is electrically connected with a low level voltage line.

6. The display device according to claim 4, wherein
the first start-stage includes a low level voltage output transistor and a second node,
the low level voltage output transistor has a gate electrode which is electrically connected with a second node, a first electrode which is electrically connected with the first electrode of the output transistor of the first start-stage, and a second electrode which is electrically connected with a low level voltage line.

7. The display device according to claim 4, wherein
the second start-stage includes a reset transistor,
the reset transistor has a gate electrode which is electrically connected with the fourth clock signal line and a first electrode which is electrically connected with the first node of the first start-stage, and a second electrode which is electrically connected with a low level voltage line.

8. The display device according to claim 4, wherein
the second start-stage includes a low level voltage output transistor and a second node,
the low level voltage output transistor has a gate electrode which is electrically connected with a second node, a first electrode which is electrically connected with the first electrode of the output transistor of the second start-stage, and a second electrode which is electrically connected with a low level voltage line.

\* \* \* \* \*